United States Patent
Lee et al.

(10) Patent No.: US 6,484,613 B1
(45) Date of Patent: *Nov. 26, 2002

(54) ELECTROMAGNETIC BOUNCE BACK BRAKING FOR PUNCH PRESS AND PUNCH PRESS PROCESS

(75) Inventors: Ho Chong Lee, Endicott, NY (US); Ganesh Subbarayan, Vestal, NY (US); Paul Gerard Wilkin, Endicott, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/440,387

(22) Filed: May 12, 1995

Related U.S. Application Data

(63) Continuation of application No. 08/097,606, filed on Jul. 27, 1993, now abandoned.

(51) Int. Cl.[7] .................................................. B26D 5/08
(52) U.S. Cl. .............................. 83/13; 83/526; 83/575; 83/588; 83/929.1; 335/277; 400/167
(58) Field of Search ........................... 83/55, 526, 575, 83/576, 577; 188/267

(56) References Cited

U.S. PATENT DOCUMENTS

| | | | |
|---|---|---|---|
| 3,678,847 A | * | 7/1972 | Pear, Jr. et al. ......... 335/277 X |
| 4,000,673 A | * | 1/1977 | Lyon ........................... 83/526 |
| 4,333,398 A | * | 6/1982 | Carson, Jr. et al. ..... 400/167 X |
| 4,569,607 A | * | 2/1986 | Takemoto ................... 400/167 |
| 4,744,684 A | * | 5/1988 | Maekawa ................... 400/167 |
| 4,821,614 A | * | 4/1989 | Fleet et al. .............. 83/575 X |
| 4,862,043 A | * | 8/1989 | Zieve ......................... 318/114 |
| 4,872,381 A | * | 10/1989 | Stroms ..................... 83/575 X |
| 4,880,322 A | * | 11/1989 | Jenson et al. .............. 400/167 |
| 5,024,127 A | * | 6/1991 | Mueller et al. ........... 83/577 X |
| 5,079,983 A | * | 1/1992 | Bruhn .......................... 83/575 |
| 5,090,284 A | * | 2/1992 | Nakajima ...................... 83/577 |
| 5,113,736 A | * | 5/1992 | Meyerle ....................... 83/575 |
| 5,233,895 A | * | 8/1993 | Coneski et al. .............. 83/575 |
| 5,269,213 A | * | 12/1993 | Coneski et al. .............. 83/577 |
| 5,410,233 A | * | 4/1995 | Carbaugh, Jr. et al. ... 83/575 X |

FOREIGN PATENT DOCUMENTS

CA 566914 * 12/1958 .................. 83/577

* cited by examiner

*Primary Examiner*—Clark F. Dexter
(74) *Attorney, Agent, or Firm*—Schmeiser, Olsen & Watts

(57) ABSTRACT

A method of punching a via or through hole in a polymer-metal laminate workpiece in a punch press. The punch press has a punch tool, a driver coil for driving the punch tool through the polymer-metal laminate workpiece, and a stopper for stopping the punch travel of the punch tool and mechanically returning the punch tool to its starting position. The method includes the steps of applying an electrical current pulse through the driver coil to electromagnetically drive the punch downward to and through the workpiece, and then elastically colliding the punch tool with the stopper to stop and return the punch tool on an upward return stroke. Subsequently a second, braking pulse is applied through the driver coil to electromagnetically brake the punch. The second electrical current is applied after the start of the punching pulse, for a time and magnitude sufficient to brake the punch press.

9 Claims, 5 Drawing Sheets

ELECTROMAGNETIC BOUNCE BACK BRAKING FOR PUNCH PRESS AND PUNCH PRESS PROCESS

CROSS REFERENCE TO RELATED APPLICATION

This is a continuation application of U.S. application Ser. No. 08/097,606, filed Jul. 27, 1993, now abandoned.

FIELD OF THE INVENTION

The invention relates to via and through hole structures especially for parallel processor packages having a plurality of printed circuit cards and/or boards, e.g., dedicated printed circuit cards and/or boards, for carrying processors, memory, and processor/memory elements. The printed circuit cards and/or boards are mounted on and interconnected through a plurality of circuitized flexible cable substrates, i.e., flex strips. The circuitized flexible cable substrates, i.e., flex strips, connect the separate printed circuit boards and cards through a central laminate portion. This central laminate portion provides Z-axis, layer to layer means for inter-processor, inter-memory, inter-processor/memory element, and processor to memory bussing interconnection, and communication through vias and through holes extending from flex strip to flex strip through the laminate. The punch press method and apparatus of the invention provides electromagnetic braking of the punch press, thereby reducing bounceback and problems concomitant therewith.

BACKGROUND OF THE INVENTION

Parallel processors have a plurality of individual processors, all capable of cooperating on the same program. Parallel processors can be divided into Multiple Instruction Multiple Data (MIMD) and Single Instruction Multiple Data (SIMD) designs.

Multiple Instruction Multiple Data (MIMD) parallel processors have individual processing nodes characterized by fast microprocessors supported by many memory chips and a memory hierarchy. High performance inter node communications coprocessor chips provide the communications links to other microprocessors. Each processor node runs an operating system kernel, with communications at the application level being through a standardized library of message passing functions. In the MIMD parallel processor both shared and distributed memory models are supported.

Single Instruction Multiple Data (SIMD) parallel processors have a plurality of individual processor elements under the control of a single control unit and connected by an intercommunication unit. SIMD machines have an architecture that is specified by:

1. The number of processing elements in the machine.
2. The number of instructions that can be directly executed by the control unit. This includes both scalar instructions and program flow instructions.
3. The number of instructions broadcast by the control unit to all of the processor elements for parallel execution.

This includes arithmetic, logic, data routing, masking, and local operations executed by each active processor element over data within the processor element.

4. The number of masking schemes, where each mask partitions the set of processor elements into enabled and disabled subsets.
5. The number of data routing functions, which specify the patterns to be set up in the interconnection network for inter-processor element communications.

SIMD processors have a large number of specialized support chips to support dozens to hundreds of fixed point data flows. Instructions come from outside the individual node, and distributed memory is supported.

Parallel processors require a complex and sophisticated intercommunication network for processor-processor and processor-memory communications. The topology of the interconnection network can be either static or dynamic. Static networks are formed of point-to-point direct connections which will not change during program execution. Dynamic networks are implemented with switched channels which can dynamically reconfigure to match the communications requirements of the programs running on the parallel processor.

Dynamic networks are particularly preferred for multi-purpose and general purpose applications, Dynamic networks can implement communications patterns based on a program demands. Dynamic networking is provided by one or more of bus systems, multistage intercommunications networks, and crossbar switch networks.

Critical to all parallel processors, and especially to dynamic networks is the packaging of the interconnection circuitry. Specifically, the interconnection must provide high speed switching, with low signal attenuation, low crosstalk, and low noise.

SUMMARY OF THE INVENTION

The invention relates to methods and apparatus for fabricating parallel processor packages. The parallel processor packages have a plurality of printed circuit cards and/or boards, e.g., dedicated printed circuit cards and/or boards, for carrying processors, memory, and processor/memory elements. The printed circuit cards and/or boards are mounted on a plurality of circuitized flexible substrates, i.e., flex strips. The circuitized flexible substrates connect the separate printed circuit boards and cards through a relatively rigid central laminate portion. This central laminate portion provides means, e.g. Z-axis means, for inter-processor, inter-memory, inter-processor/memory element, and processor to memory bussing interconnection, and communication.

Parallel processor systems have a plurality of individual processors, e.g., microprocessors, and a plurality of memory modules. The processors and the memory can be arrayed in one of several interconnection topologies, e.g., an SIMD (single instruction/multiple data) or an MIMD (multiple instruction/multiple data).

The memory modules and the microprocessors communicate through various topologies, as hypercubes, and toroidal networks, solely by way of exemplification and not limitation, among others. These inter-element communication topologies have various physical realizations. According to the invention described in the commonly assigned, copending U.S. Patent Applications listed above the individual logic and memory elements are on printed circuit boards and cards. These printed circuit boards and cards are, in turn, mounted on or otherwise connected to circuitized flexible substrates extending outwardly from a relatively rigid, circuitized laminate of the individual circuitized flexible substrates. The intercommunication is provided through a switch structure that is implemented in the laminate. This switch structure, which connects each microprocessor to each and every other microprocessor in the parallel processor, and to each memory module in the parallel processor, has the physical structure shown in FIG. 1 and the logical/electrical structure shown in FIG. 2.

More particularly, the preferred physical embodiment of this electrical and logical structure is a multilayer switch structure shown in FIG. 1. This switch structure provides separate layers of flex 21 for each unit or pairs of units, that is, each microprocessor, each memory module, or each microprocessor/memory element. The planar circuitization, as data lines, address lines, and control lines are on the individual printed circuit boards and cards 25, which are connected through the circuitized flex 21, and communicate with other layers of flex through Z-axis circuitization (vias and through holes) in the central laminate portion 41 in FIG. 1. The bus structure is illustrated in FIG. 2, which shows a single bus, connecting a plurality of memory units through a bus, represented by OR-gates, to four processors. The Address Bus, Address Decoding Logic, and Read/Write Logic are not shown. The portion of the parallel processor represented by the OR gates, the inputs to the OR gates, and the outputs from the OR gates is carried by the laminated flex structure 41.

Structurally the parallel processor 11 has a plurality of integrated circuit chips 29, as processor chips 29a mounted on a plurality of printed circuit boards and cards 25. For example, the parallel processor structure 11 of our invention includes a first processor integrated circuit printed circuit board 25 having a first processor integrated circuit chip 29a mounted thereon and a second processor integrated circuit printed circuit board 25 having a second processor integrated circuit chip 29a mounted thereon.

Analogous structures exist for the memory integrated circuit chips 29b, the parallel processor 11 having a plurality of memory chips 29b mounted on a plurality of printed circuit boards and cards 25. In a structure that is similar to that for the processor chips, the parallel processor 11 of our invention includes a first memory integrated circuit printed circuit board 25 having a first memory integrated circuit chip 29b mounted thereon, and a second memory integrated circuit printed circuit board 25 having a second memory integrated circuit chip 29b mounted thereon.

Mechanical and electrical interconnection is provided between the integrated circuit chips 29 mounted on different printed circuit boards or cards 25 by a plurality of circuitized flexible strips 21. These circuitized flexible strips 21 each have a signal interconnection circuitization portion 211, a terminal portion 213 adapted for carrying a printed circuit board or card 25, and a flexible, circuitized portion 212 between the signal interconnection circuitization portion 211 and the terminal portion 213. The signal interconnection circuitization portion 211, has X-Y planar circuitization 214 and vias and through holes 215 for Z-axis circuitization.

The flexible circuitized strips 21 are laminated at their signal interconnection circuitization portion 211. This interconnection portion is built up as lamination of the individual circuitized flexible strips 21, and has X-axis, Y-axis, and Z-axis signal interconnection between the processor integrated circuit chips 29a and the memory integrated circuit chips 29b. In the resulting structure the circuitized flexible strips 21 are laminated in physical and electrical connection at their signal interconnection circuitization portions 211 and spaced apart at their terminal portions 213.

The power core 221 may be a copper foil, a molybdenum foil, or a "CIC" (Copper-Invar-Copper) laminate foil. The circuitized flexible strip 21 may be a 1S1P (one signal plane, one power plane) circuitized flexible strip, a 2S1P (two signal planes, one power plane) circuitized flexible strip or a 2S3P (two signal planes, three power planes) circuitized flexible strip.

The circuitized flexible strip 21 can have either two terminal portions 213 for carrying printed circuit boards 25 at opposite ends thereof, or a single terminal portion 213 for carrying a printed circuit board 25 at only one end of the circuitized flexible cable 21.

The connection between the printed circuit boards and cards 25 and the terminal portions 213 of the circuitized flexible strip 21 may be provided by dendritic Pd along the edge of terminal portion 213.

The solder alloy means for pad to pad joining of the circuitized flexible strips 21 at the signal interconnection circuitization portions 211 thereof is an alloy composition having a final melting temperature, when homogenized, above the primary thermal transition temperature of the dielectric material and having a system eutectic temperature below the primary thermal transition temperature of the dielectric. This can be a series of Au and Sn layers having a composition that is gold rich with respect to the system eutectic, said alloy having a system eutectic temperature of about 280 degrees Centigrade, and a homogeneous alloy melting temperature above about 400 degrees Centigrade, and preferably above about 500 degrees Centigrade.

In one embodiment our invention provides a method of punching a via or through hole in a polymer-metal laminate workpiece in a punch press. The punch press has a punch tool, a driver coil for driving the punch tool through the polymer-metal laminate workpiece, and elastic means for stopping the punch travel of the punch tool and mechanically returning the punch tool to its starting position. The method of the invention includes the steps of applying an electrical current pulse through the driver coil to electromagnetically drive the punch downward to and through the workpiece, and then elastically colliding the punch tool with stopping means to stop and return the punch tool on an upward return stroke. This is followed by applying a second, braking pulse through a driver coil means to electromagnetically brake the punch. The second electrical current is applied after the start of the punching pulse, for a time and magnitude sufficient to brake the punch press.

The punch press of our invention includes a bed for carrying a workpiece, a punch press tool adapted to move with respect to the bed, a driver coil capable of being energized by an electric current applied thereto, a stopper for elastically stopping the punch and for returning the punch, and an electromagnetic brake for electromagnetically braking the return of the punch.

The electromagnetic brake means for braking the return of the punch includes electrical circuitry for applying a braking pulse to the driver coil, for example by applying the second pulse after a fixed time has elapsed since the first pulse.

THE FIGURES

The invention may be understood by reference to the Figures appended hereto.

DETAILED DESCRIPTION OF THE INVENTION

Figure 1:
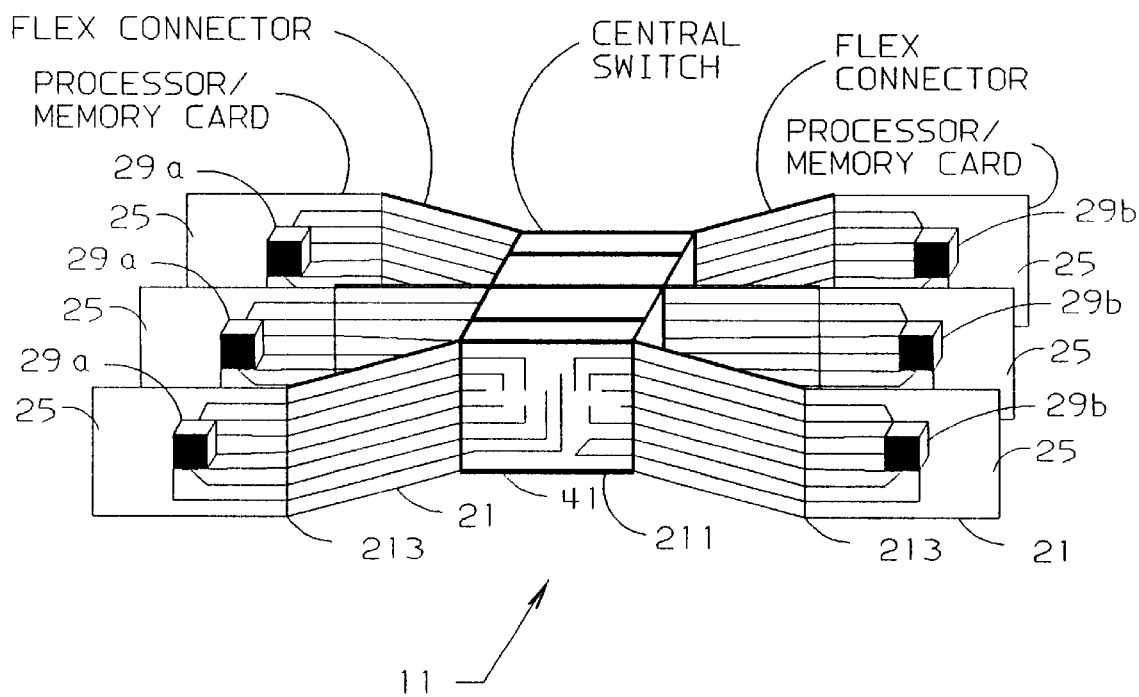
FIG. 1 shows an overview of the mechanical and structural features of the parallel processor package of the invention.

The invention described herein relates to a parallel processor and more specifically relates to methods and apparatus for fabricating advanced parallel processor packages such as a parallel processor package 11 having a plurality of integrated circuit chips 29, e.g., microprocessors 29a, preferably advanced microprocessors, and memory modules 29b, mounted on printed circuit cards and boards 25, and connected through a laminate 41 of circuitized flexible strips 21 as will be described herein below. The structure and methods of fabricating the structure and similar structures are useful in parallel processors, in bank switched memory with memory banks or fractional memory banks on an individual flex connector, and for providing flex cable to flex cable connection in a heavily interconnected network.

Advanced microprocessors, such as pipelined microprocessors and RISC (reduced instruction set computer) microprocessors provide dramatic increases in chip level integration and chip level circuit densities. These advanced microprocessors, in turn, place increasing demands on wiring densities and interconnections at the next lower levels of packaging. Moreover, when advanced microprocessors are combined into multi-processor configurations, i.e., parallel processors, as SIMD and MIMD parallel processors, still higher levels of performance, circuit density, including logic density and memory density, and I/O packaging, are all required.

Figure 2:
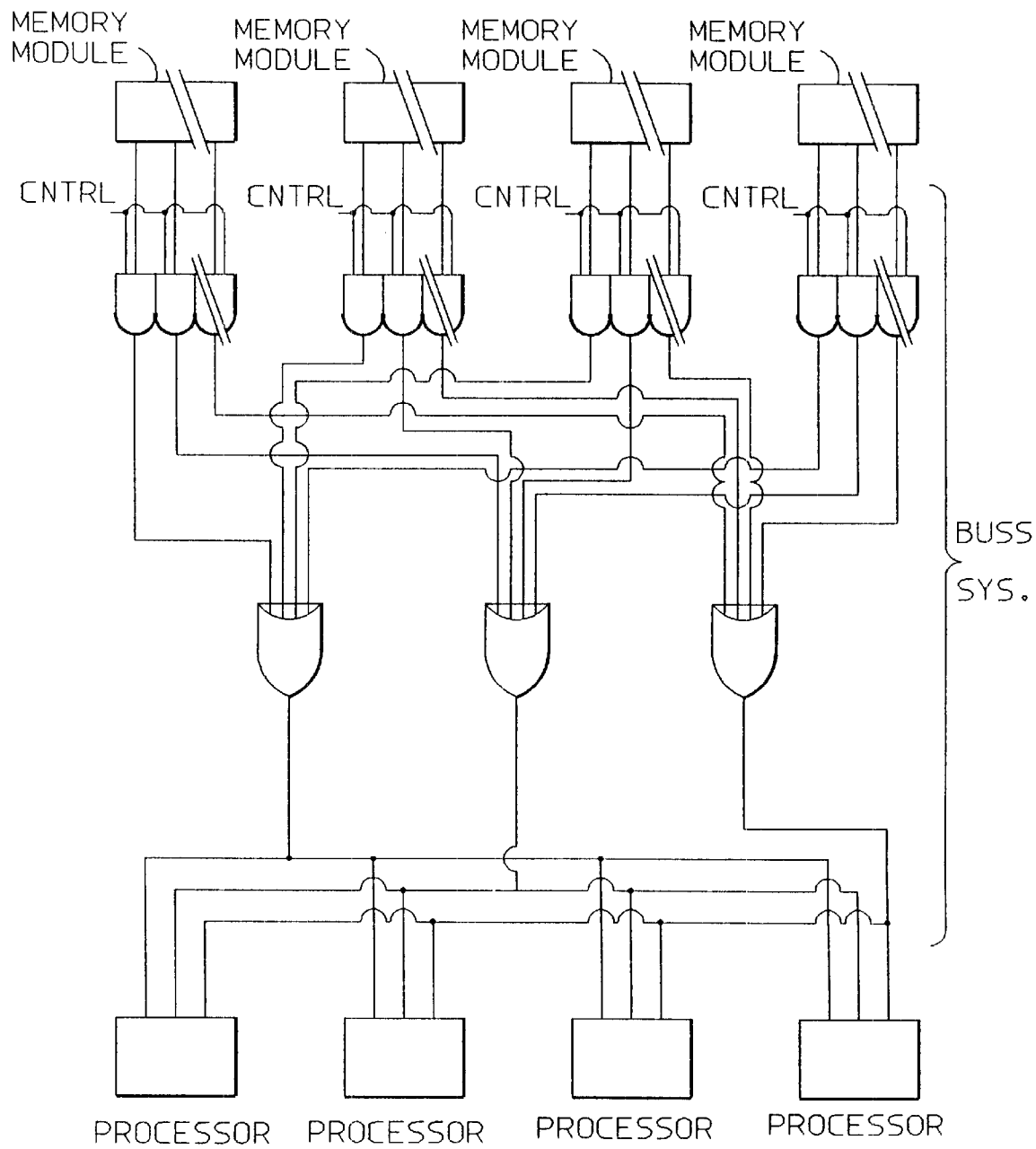
FIG. 2 shows a generalized and simplified schematic of one bus of bus structures that can be implemented in the package of the invention.
Figure 3:
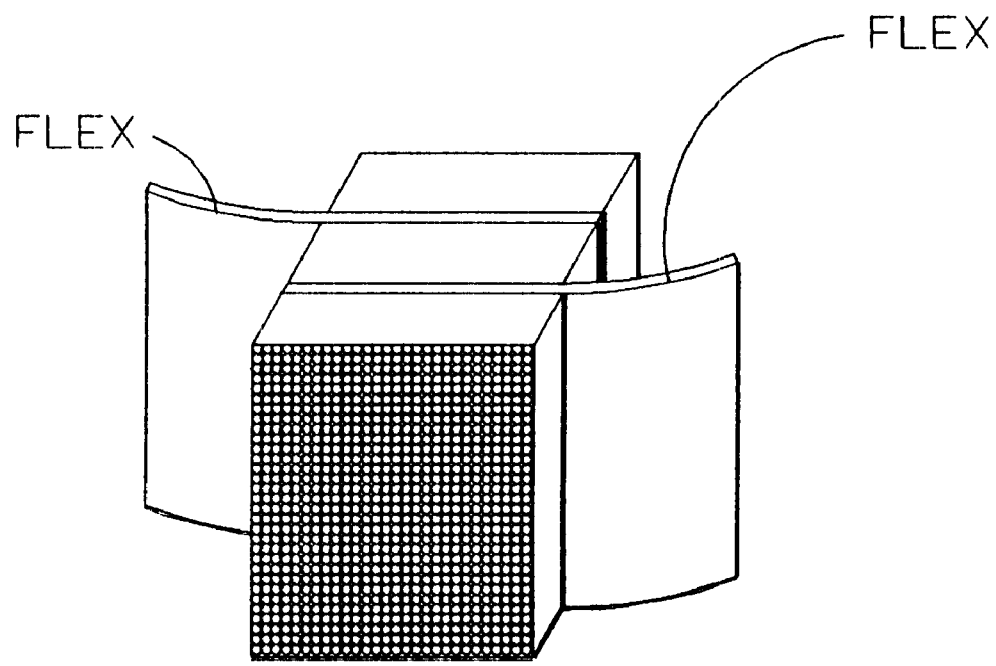
FIG. 3 shows the lamination of circuitized flexible strips to form a laminate with free portions.

The basic parallel processor structure 11, e.g., an SIMD or an MIMD parallel processor, builds from a plurality of microprocessors 29a and a plurality of memory modules 29b, with the memory modules 29b and the microprocessors 29a communicating through a laminate switch structure 11. This switch, which connects each microprocessor 29a to each and every other microprocessor 29a in the parallel processor and to each memory module 29b in the parallel processor has the logical/electrical structure shown in FIG. 2 with memory modules 29b joined to the processors 29a by a system of switchable AND gates 501 and OR gates 503 in a data bus arrangement.

Laminate Switch Structure

Figure 4:
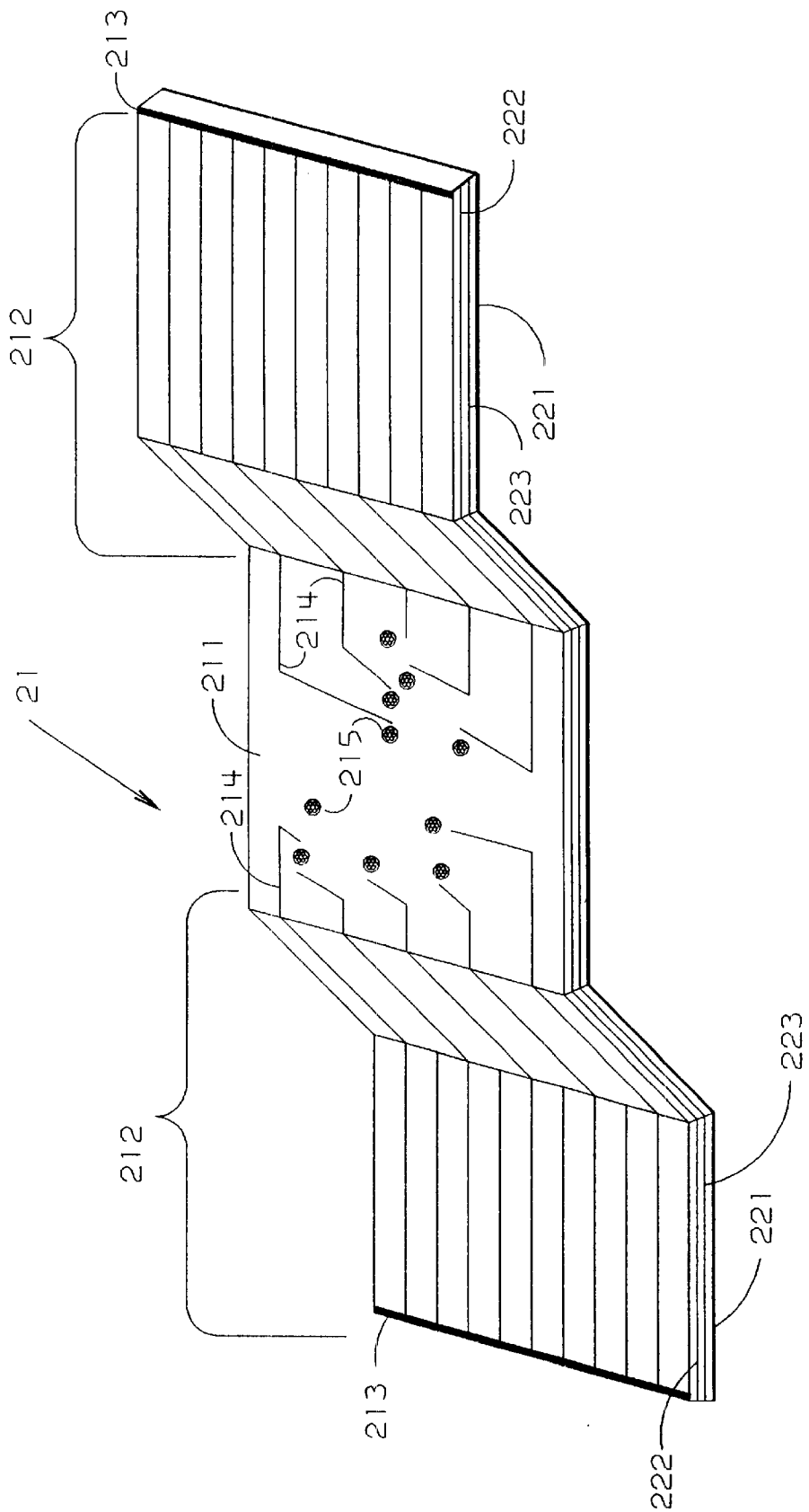
FIG. 4 shows a perspective view of a circuitized flexible strip of the invention having surface circuitization, Pd dendrites for connecting the printed circuit boards or cards thereto, and joining metallurgy, vias, and through holes on the portion intended to be laminated.

The parallel processor package 11 integrates carrier, connector, and I/O into a single package, with multiple circuitized flexible cables 21 that are built into a carrier cross section 41 using discrete subassemblies 21 which are laminated together to form a Z-axis signal and power connection laminate 41 between the discrete subassemblies 21. A discrete subassembly is shown generally in FIG. 4.

The physical embodiment of the package 11 yields high performance by utilizing high wirability printed circuit board technology that enhances present printed circuit card and board technology for massively parallel processor systems, while providing cost and performances advantages. Both the laminate 41, which we refer to as a central, switch, or rigid portion, and the outwardly extending flex portions 21 (intended for attachment to printed circuit boards or cards 25 carrying the memory modules 29b and the logic modules 29a) are characterized by printed circuit board like cross sections, and a low dielectric constant polymer substrate.

The physical embodiment of this electrical and logical structure encompasses the multilayer laminate switch structure shown in FIG. 1. This switch structure provides a separate layer of flex 21 for each printed circuit board or card 25 or each pair thereof. Each individual printed circuit board or card 25 can carry a microprocessor 29a, a memory module 29b, I/O, or a microprocessor/memory element. The planar circuitization 214, as data lines, address lines, and control lines is on the flex 21, and communicates with other layers of flex 21 through vias and through holes 215 in the laminate central portion 41, shown in FIG. 4.

This laminate flex design provides a large number of I/O's, for example twenty five thousand or more, from the package 11 while eliminating the need for the manufacture, alignment, and bonding of discrete flex cables extending outwardly from a single panel. A conventional planar panel would have to be many times larger to have room for the same connectivity as the integrated flex/rigid/flex or rigid/flex of the invention.

Flex Card Carriers Joined at a Central Laminate Switch Portion

The package combines a laminate central or switch portion 41 and circuitized flexible strip extensions 21 extending outwardly therefrom and carrying terminal printed circuit boards and cards 25 for circuit elements 29a and 29b, as integrated circuit chips 29, thereon.

Heretofore flex cables and flex carriers have been integrated onto one or two surfaces, i.e., the top surface or the top and bottom surfaces, of a carrier. However, the flex cables 21 are integrated into a central switch or carrier structure 41 as a laminate with a plurality of stacked, circuitized flex strips 21. The area of selective lamination of the flex carriers 21 in the central region 211 forms the rigid laminate carrier 41. This laminate region 41 carries the Z-axis circuitization lines from flex 21 to flex 21.

The individual plies of flex 21 have internal conductors, i.e., internal power planes 221 and internal signal planes 222. Additionally, in order to accommodate the narrow dimensional tolerances associated with the high I/O density, high wiring density, and high circuit density, it is necessary to carefully control the Coefficient of Thermal Expansion (CTE) of the individual subassemblies. This is accomplished through the use of an internal metallic conductor 221 of matched coefficient of thermal expansion (CTE), such a molybdenum foil or a Cu/Invar/Cu foil, to which the layers of dielectric 223 are laminated.

The combination of circuitized flex 21 extending outwardly from a central laminate section 41, with vias 215 and through holes 215 electrically connecting separate plies 21 of circuitized flex therethrough, reduces the footprint associated with the chip carrier, as wiring escape is easier.

This structure offers many advantages for a parallel processor, especially a massively parallel processor, as well as any other heavily interconnected system. Among other advantages, a reduced size chip carrier is possible, as escape is made easier, signal transmission lengths are reduced, and discontinuities due to contact mating between chip carrier and flex are reduced and reliability is enhanced as the chip carrier and the flex are a single entity.

The design of the parallel processor package calls for all vertical (Z-axis) connections to be made by bonding a joining alloy, e.g., transient liquid phase bonding Au/Sn, and the organic dielectric, as a perfluoropolymer, into a laminate of circuit panels, while the outwardly extending edges 212 and 213 of the panels 21 are not bonded, so that they can act as circuitized flex cables. This flexibility or bendability allows the printed circuit boards and cards 25 to be offset from one another remote from the laminate 41.

Detailed Structural Design and Fabrication

According to a preferred embodiment, the central switch portion, i.e., the laminate portion, and the flex strips, used as card carriers in a manner analogous to expansion slots, are a single structural entity. This is achieved by selectively defining and controlling the adhesion between the layers of the structure. The layers can be either (1) discrete 2S3P (2 signal plane, 3 power plane) structures, or (2) combinations of discrete 2S3P (2 Signal plane, 3 power plane) and 2S1P (2 signal plane, 1 power plane) structures.

Fabrication of Vias, Through Holes, and Plated Through Holes

The Z-axis intensive design of the laminate or "switch" portion of the parallel processor package requires special attention and care in the fabrication of the package. This is especially true for the vias and through holes.

Punching Vias and Through Holes

A problem encountered in fabricating the individual subassemblies 21 is that it is difficult to drill the Cu/Invar/Cu foil laminates 221. This is because of the disparity of the properties of the metals in the tri-layer laminate 221. However, according to one embodiment it is now possible to produce power connections through the Cu/Invar/Cu laminate 221. According to this embodiment of our invention the copper on one side of the CIC laminate is photoetched. Then the Invar is partially etched. This is followed by drilling the Invar and drilling through the bottom layer of Cu. As a result of this multi-step process the Cu has a smaller diameter for electrical connection to the power lines.

This method of producing a subassembly 21, i.e., a signal/power plane building block, is characterized by reduced handling of thin cores, increased ease of signal to power plane registration, dimensional stability of signal and power planes during subsequent lamination steps, and high throughput hole punching. Moreover, this process is adaptable to parallel processing. The resulting subassemblies are triplate subassemblies.

According to a still further embodiment the vias and thru holes are punched in the individual subassemblies. Punching is accomplished using a punch having active electromagnetic damping. This allows hole punching to be carried out at both higher punching energies and faster punch cycles.

Figure 5:
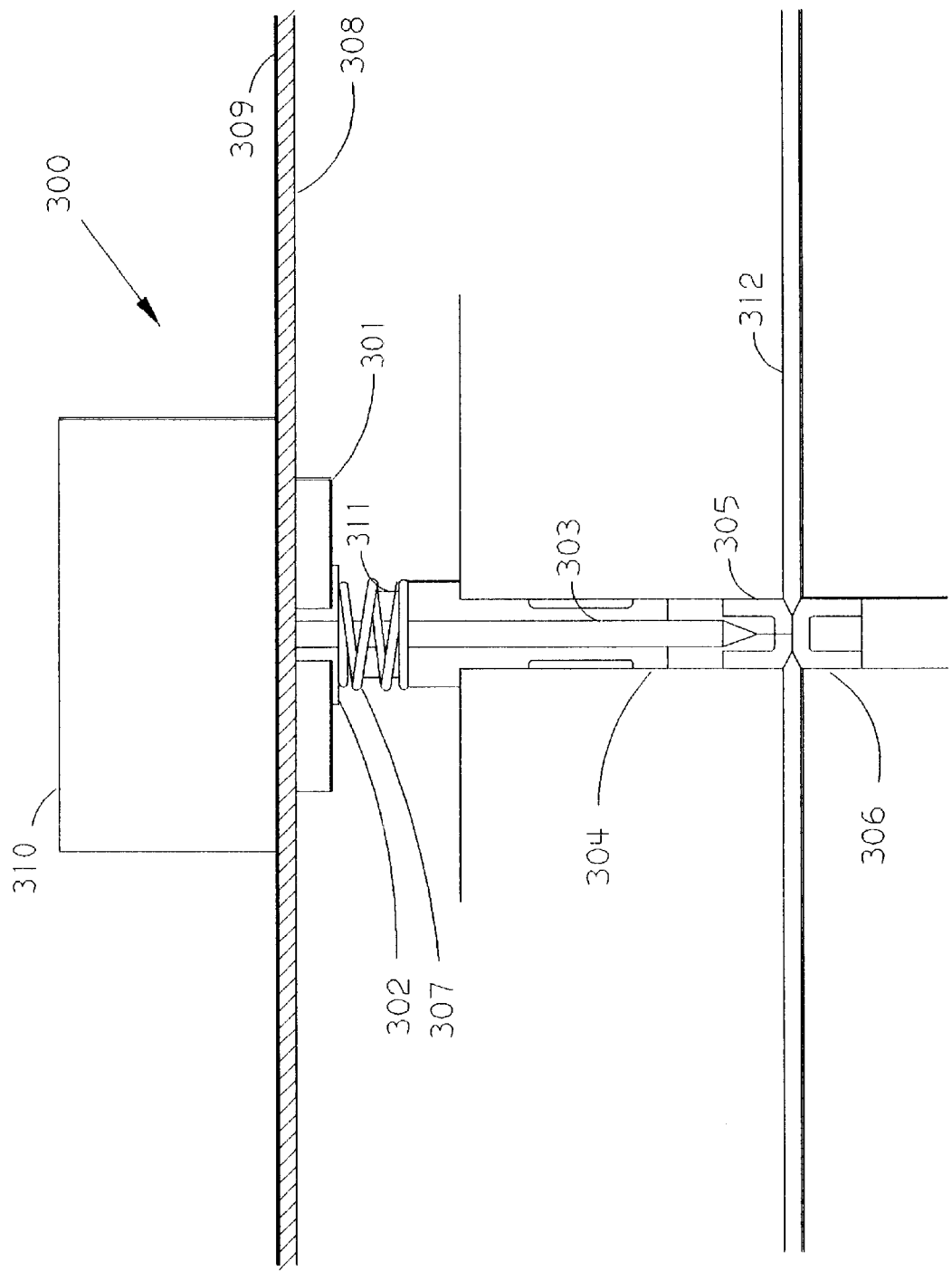
FIG. 5 is a schematic view of a punch press with means for electromagnetic braking of bounceback.

A cross section of a punch press having active electromagnetic damping is shown in FIG. 5. The punch press 300 consists of a driver coil 310 that magnetizes a copper disk 301, and a steel collar 302, to drive a punch 303. The punch 303 is driven electromagnetically downward through a work piece 312 on a workpiece bed 313. The moving punch 303 is guided by bushings, a punch guide bushing 304 and a stripper bushing 305. At the top of a cycle the punch copper disc 301 is in contact with a layer of damping material 308 and a polymeric insulator 309. This insulates the copper disc 301 from the driver coil 310.

The punch cycle begins with the punch 303 held in its rest position by the spring 307. A punching current pulse is sent through the driver coil 310. The resulting field in the driver coil 310 induces an eddy current in the copper disc 301. This eddy current has a magnetic field that is of proper polarity with respect to the magnetic field of the driver coil 310. This results in a magnetic force that electromagnetically drives the punch 303 downward to and through the workpiece 312. The downward punch 303 stroke is restricted by an elastic collision between the steel collar 302 and the top surface of the punch guide bushing 304. This elastic collision sends the punch 303 on its upward return stroke where the copper disc 301 inelastically impacts the damper 308, 309. The second or inelastic collision serves to dissipate some of the unwanted energy of the punch press 300. However, the inelastic collision causes an undesirable bounceback, and places a limit on cycle time. According to the invention described herein an electromagnetic braking force is applied in the punch press 300 during its return stroke.

The electromagnetic force is applied after the start of the punching pulse and is applied for a time and magnitude sufficient to brake the punch.

According to this embodiment of the invention there is provided a punch press 300 having a bed 313 for carrying a workpiece 312, e.g., a circuitized flexible strip or a circuitizable flex strip 21. A punch 303 is provided to move vertically with respect to the bed 313. The punch 303 is driven downward to and through the work piece 312 by a driver coil 310 which is energized by an electric current thereto. The punch press 300 further includes a copper disc 301, a steel collar 302, a spring 307, a punch guide bushing 304, and a stripper bushing 305. According to the invention there is also provided means, as additional circuitry, to trigger the braking pulse to the driver coil 310, as a switch 314 or another coil, e.g., a reversing or braking coil.

According to the method of our invention there is provided means for applying a braking electromagnetic field in the punch press 300 to brake the bounce back movement of the punch, and thereby reduce the bounceback. In a preferred embodiment of our invention this is accomplished by a second pulse supplied to the driver coil 310 after a certain time has elapsed since the first pulse, thereby braking the bounceback of the punch. The method and apparatus of the invention allows a very high punch energy to be applied to the work piece.

In an alternative embodiment the bounceback is limited by a second, bounceback limiting coil. The use of a second coil, i.e., a bounce back limiting coil, provides independently controlled braking means, and reduces the transient period of the coil. In this way the bounce back is limited. The method and apparatus of the invention allow very high punch energies to be applied to the workpiece.

While the invention has been described with respect to certain preferred embodiments and exemplifications, it is not intended to limit the scope of the invention, but solely by the claims appended hereto.

We claim:

1. A method of punching a via or through hole in a polymer-metal laminate workpiece in a punch press, comprising the step of:

providing the punch press having a punch, a driver coil for driving said through said polymer-metal laminate workpiece, return means in said punch press for stopping travel of said punch and mechanically returning said punch to a starting position, and a damping material for dissipating energy from said punch during the mechanical return of said punch;

applying a punching pulse electrical current through said driver coil to electromagnetically drive said punch downward to and through said workpiece;

colliding said punch with said return means in said punch press to stop and return said punch on an upward return stroke;

applying a braking pulse electrical current through said driver coil after the start of said punching pulse electrical current for a time and magnitude sufficient to electromagnetically brake said punch, resulting in a first reduction of bounceback of said punch; and absorbing energy from said punch by said damping material, resulting in a second reduction of bounceback of said punch, wherein the step of providing the punch press comprises providing the punch press such that punch press further comprises a copper disk and a polymeric insulator that insulates said copper disk from said driver coil, such that the driver coil magnetizes the copper disk to drive the punch, and such that the polymeric insulator is in contact with both the driver coil and the damping material.

2. The method of claim 1, wherein the step of providing the punch press includes having said copper disk in contact with said damping material when said punch is at said starting position.

3. The method of claim 1, wherein the step of providing the punch press comprises providing the punch press such that punch press further comprises a steel collar, and wherein the colliding step comprises elastically colliding said steel collar with a punch guide bushing.

4. The method of claim 1, wherein the step of providing the punch press comprises providing the punch press such that punch press further comprises a spring adapted to hold said punch at rest when said punch is at said starting position.

5. The method of claim 1, wherein the step of applying a braking pulse electrical current includes using additional circuitry to trigger the breaking pulse.

6. The method of claim 1, wherein the step of applying a braking pulse electrical current includes using a reversing or braking coil.

7. The method of claim 1, wherein the step of applying a braking pulse electrical current includes using a switch.

8. The method of claim 1, further comprising applying a brake pulse electric current through a bounceback limiting coil that is independent of the driver coil, after the start of said punching pulse electrical current, resulting in enhancing the first reduction of bounceback of said punch.

9. The method of claim 1, wherein the workpiece comprises a layer of Invar coupled to a layer of copper, and wherein the step of applying a punching pules drives said punch through the layer of Invar and the layer of copper.

* * * * *